(12) United States Patent
Xiao

(10) Patent No.: US 10,750,638 B2
(45) Date of Patent: Aug. 18, 2020

(54) INTEGRATED LIQUID-COOLED HEAT DISSIPATION SYSTEM

(71) Applicant: GUANGDONG APALTEK LIQUID COOLING TECHNOLOGY CO., LTD., Dongguan (CN)

(72) Inventor: Qineng Xiao, DongGuan (CN)

(73) Assignee: GUANGDONG APALTEK LIQUID COOLING TECHNOLOGY CO., LTD., Qingxi Town, Dongguan (CN)

(*) Notice: Subject to any disclaimer, the term of this patent is extended or adjusted under 35 U.S.C. 154(b) by 41 days.

(21) Appl. No.: 16/183,690

(22) Filed: Nov. 7, 2018

(65) Prior Publication Data
US 2019/0075681 A1 Mar. 7, 2019

(30) Foreign Application Priority Data
Jun. 3, 2018 (CN) .......................... 2018 1 0560218

(51) Int. Cl.
| | | |
|---|---|---|
| *F28D 15/00* | (2006.01) | |
| *H05K 7/20* | (2006.01) | |
| *F28F 1/12* | (2006.01) | |
| *H01L 23/34* | (2006.01) | |
| *F28D 1/053* | (2006.01) | |
| *F28D 1/02* | (2006.01) | |
| *F28D 21/00* | (2006.01) | |

(52) U.S. Cl.
CPC ......... *H05K 7/20263* (2013.01); *F28D 1/024* (2013.01); *F28D 1/05375* (2013.01); *F28F 1/126* (2013.01); *H01L 23/34* (2013.01); *H05K 7/20272* (2013.01); *F28D 2021/0031* (2013.01); *F28F 2250/08* (2013.01)

(58) Field of Classification Search
CPC ............ H05K 7/20263; H05K 7/20272; F28D 1/024; F28D 1/05375; F28D 2021/0031; F28F 1/126; F28F 2250/08; H01L 23/34
USPC .................................................... 165/104.25
See application file for complete search history.

(56) References Cited

U.S. PATENT DOCUMENTS

| | | | | |
|---|---|---|---|---|
| 4,211,207 A | * | 7/1980 | Molivadas | F24S 10/503 |
| | | | | 126/587 |
| 6,730,115 B1 | * | 5/2004 | Heaton | A47C 21/044 |
| | | | | 5/421 |
| 2005/0050890 A1 | * | 3/2005 | Shinohara | F01N 3/043 |
| | | | | 60/618 |
| 2016/0231021 A1 | * | 8/2016 | Roetker | F25B 17/02 |

\* cited by examiner

*Primary Examiner* — Davis D Hwu
(74) *Attorney, Agent, or Firm* — Chun-Ming Shih; HDLS IPR Services

(57) ABSTRACT

An integrated liquid-cooled heat dissipation system includes a heat dissipation device, a pumping device, a water reservoir, and a heat absorption device. The heat dissipation device, the pumping device, the water reservoir, and the heat absorption device are integrated as a whole and interconnected with each other, a main body of the heat dissipation device is provided with the pumping device; the water reservoir is integratedly arranged on and connected to the heat dissipation device; and the heat absorption device is arranged on the water reservoir.

11 Claims, 17 Drawing Sheets

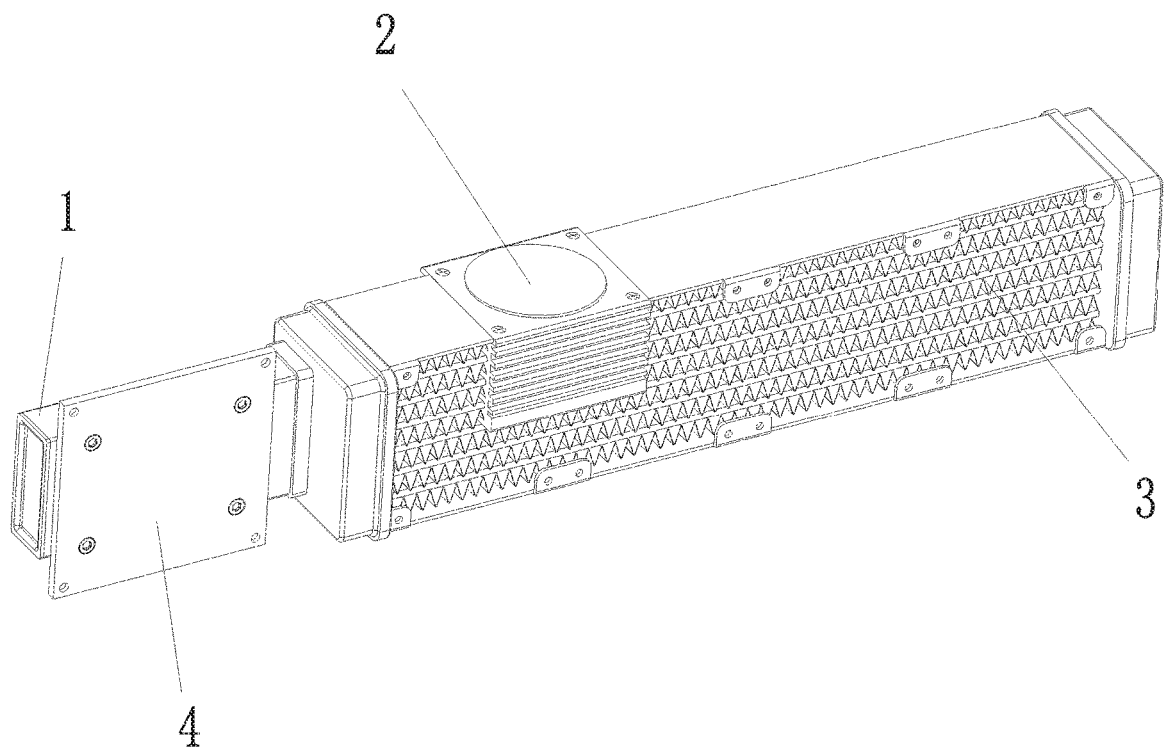
FIG. 1-a
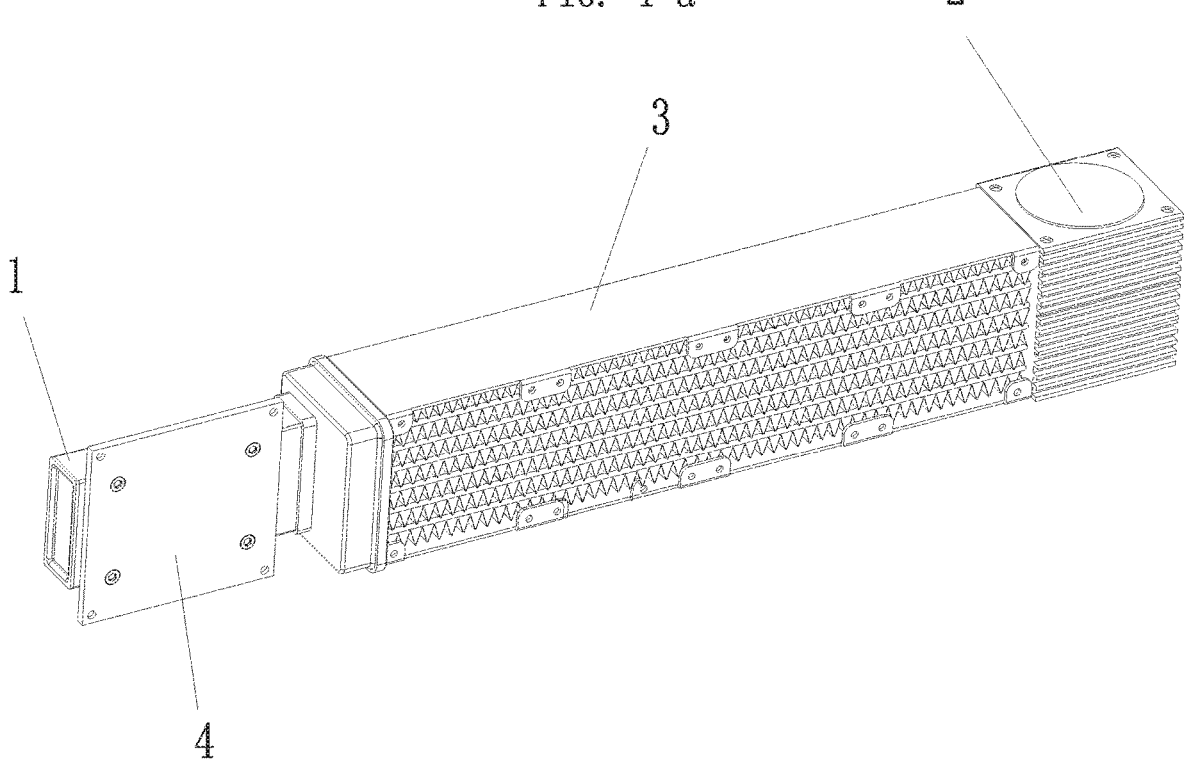
FIG. 1-b

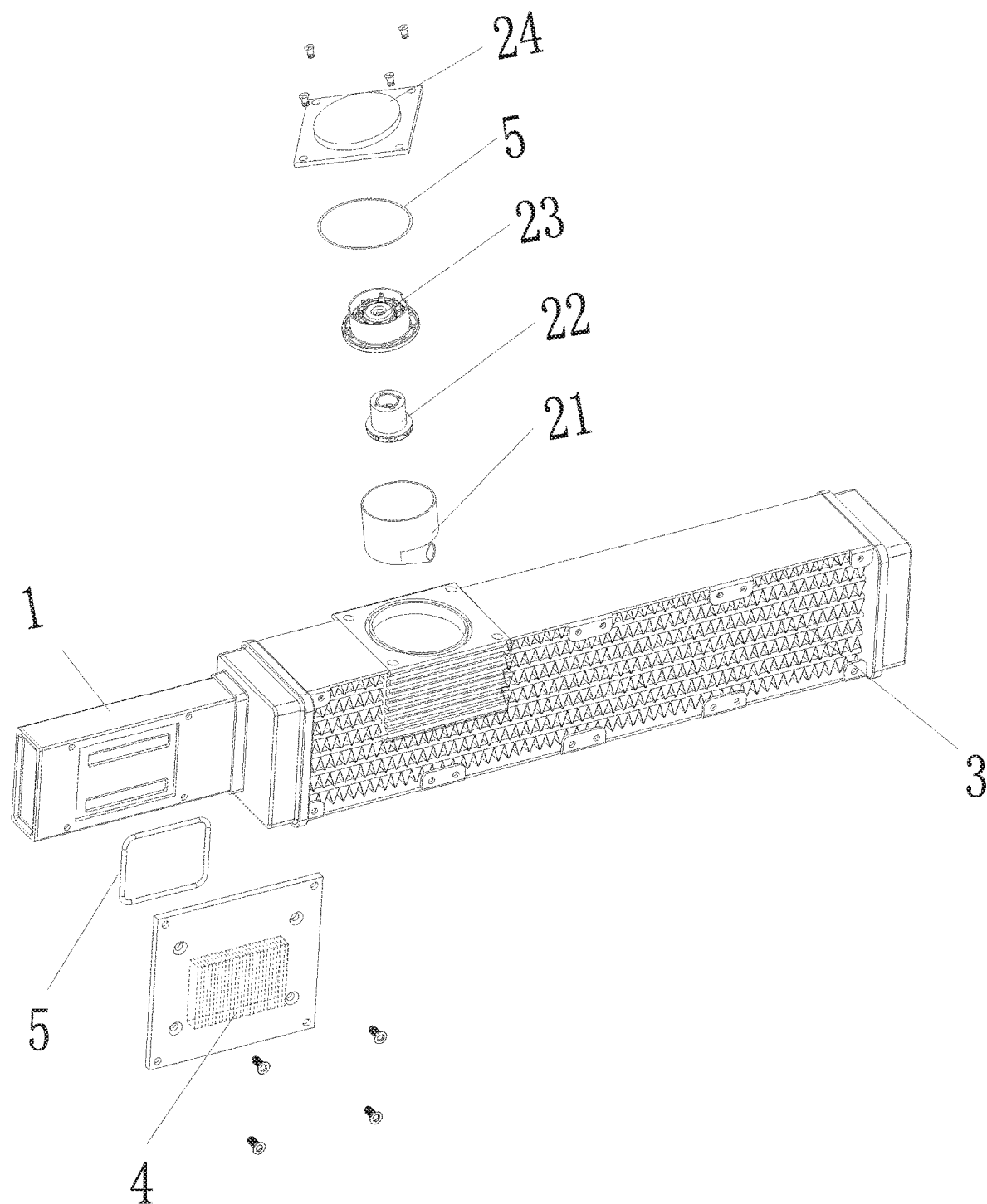
FIG. 2-a

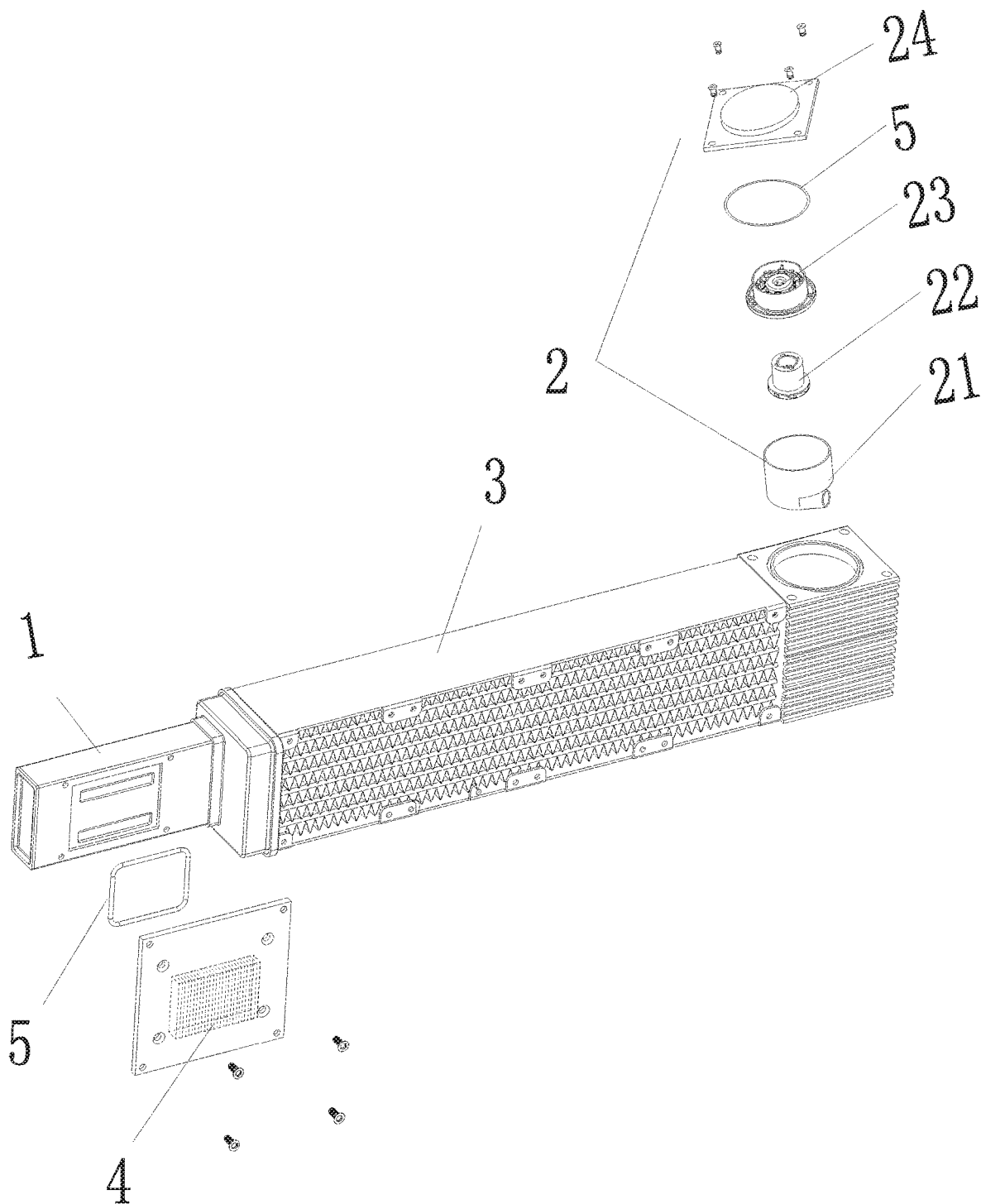
FIG. 2-b

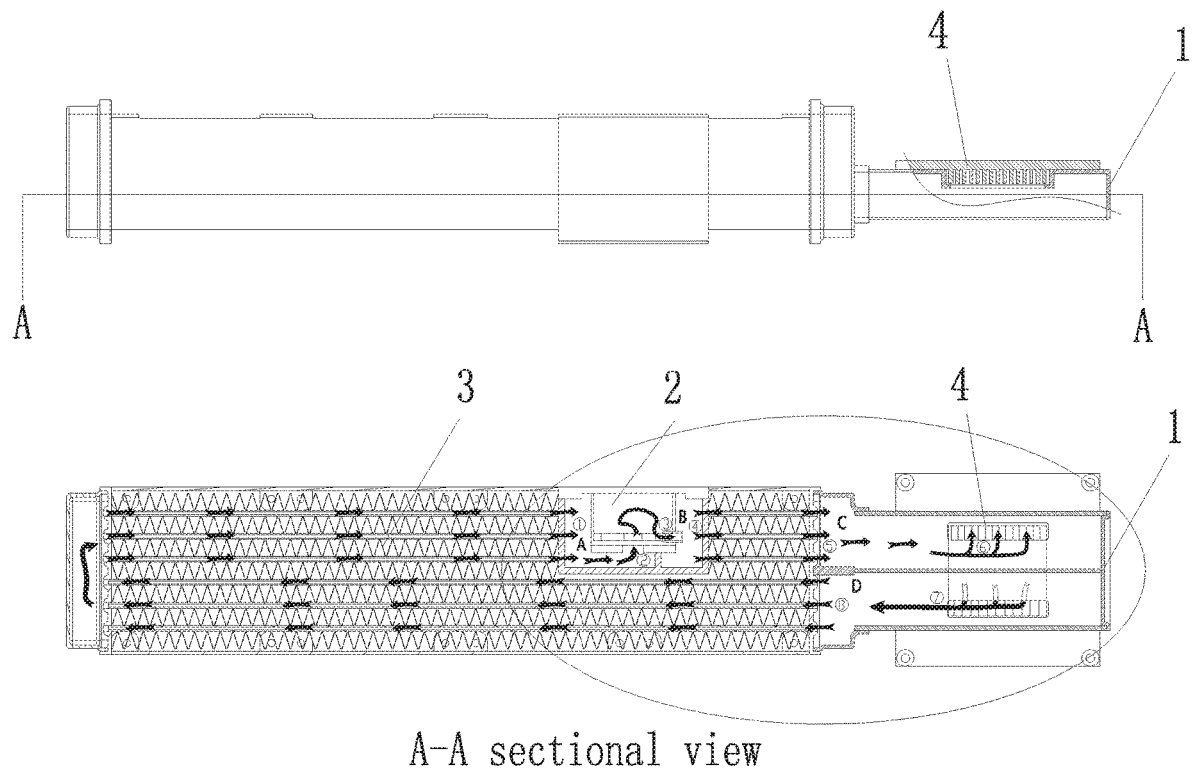
A-A sectional view
FIG. 3-a
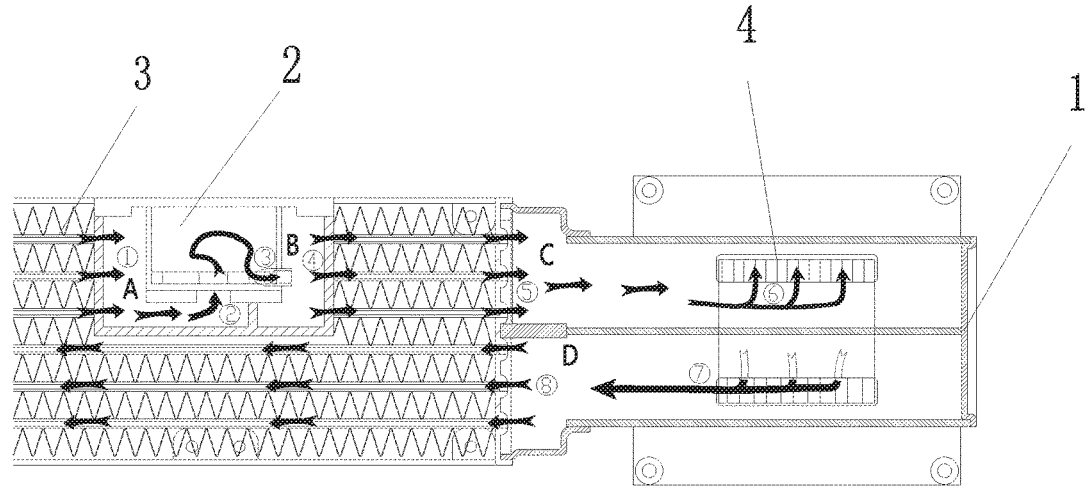
FIG. 3-a1

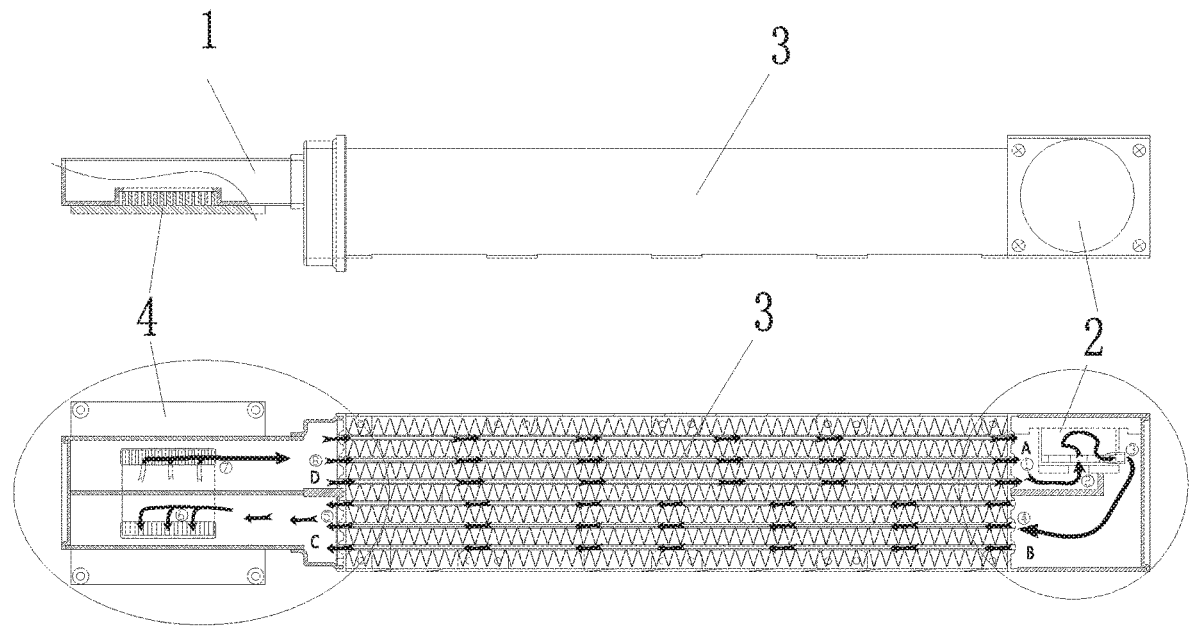
FIG. 3-b
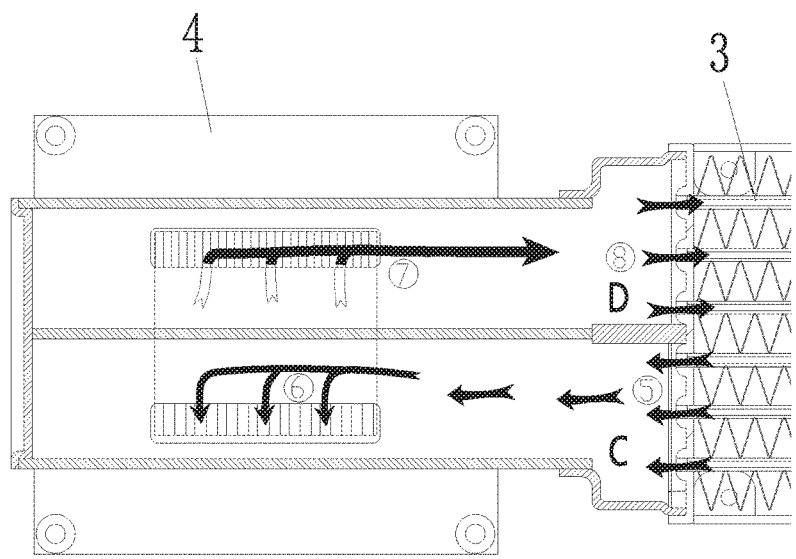
FIG. 3-b1

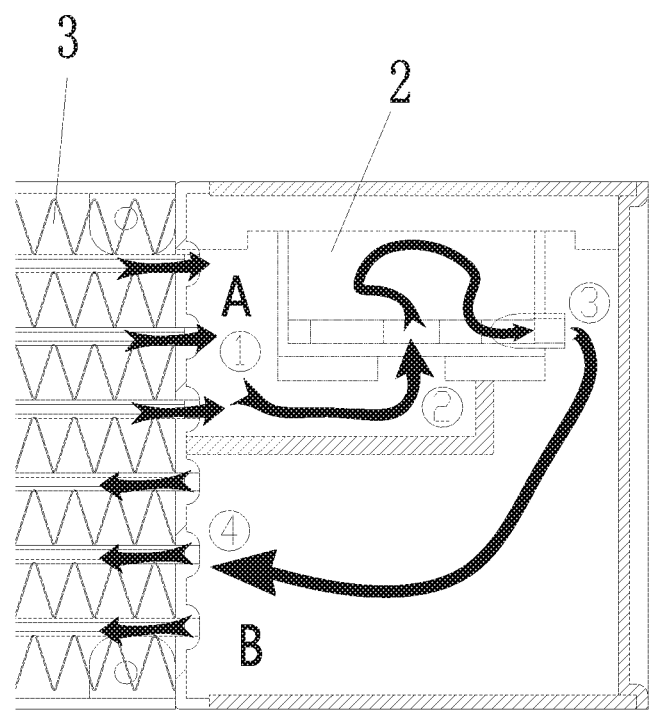
FIG. 3-b2
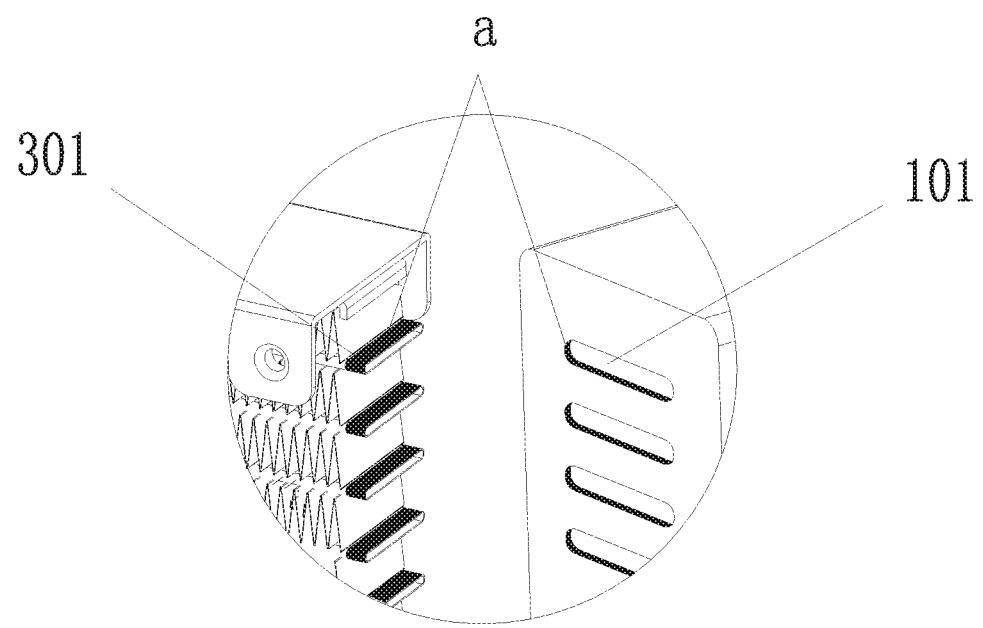
FIG. 4-a

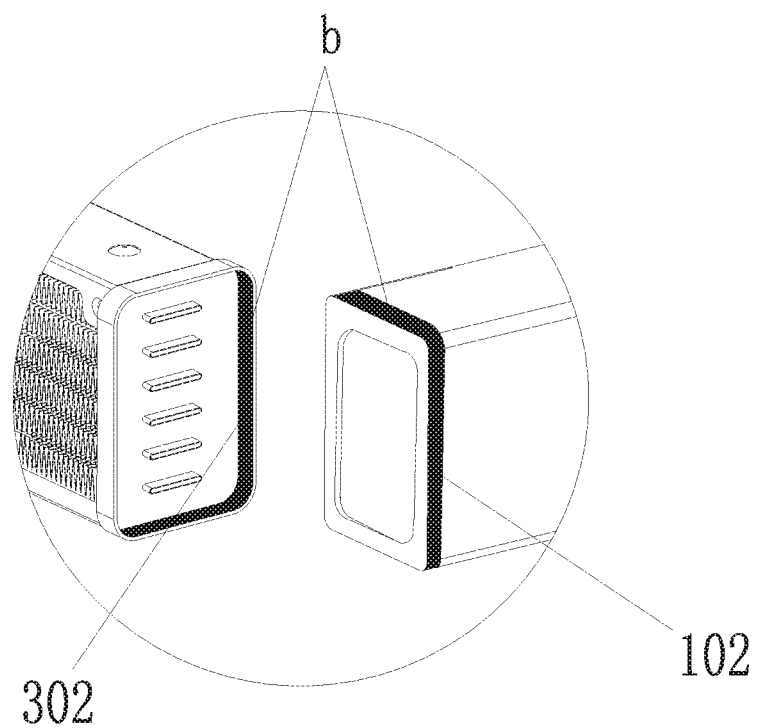
FIG. 4-b
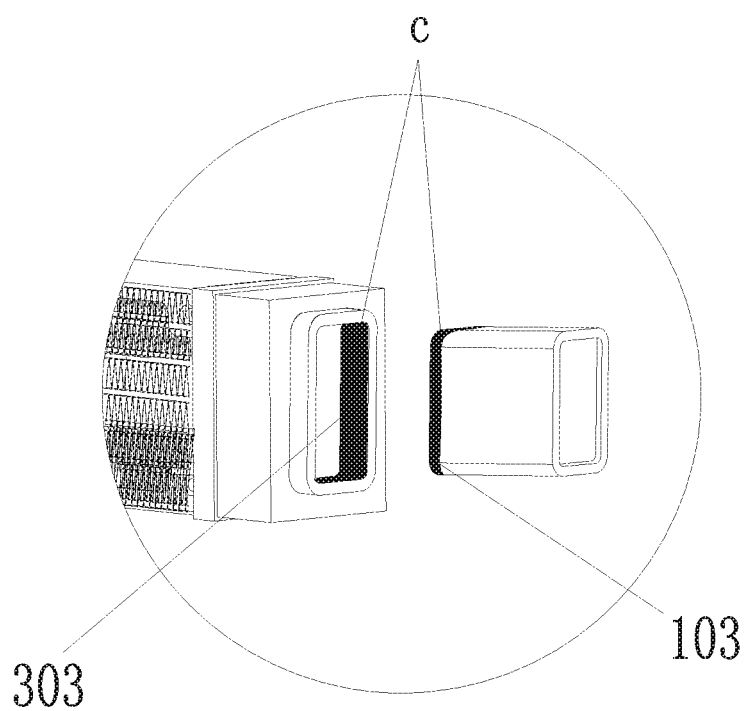
FIG. 4-c

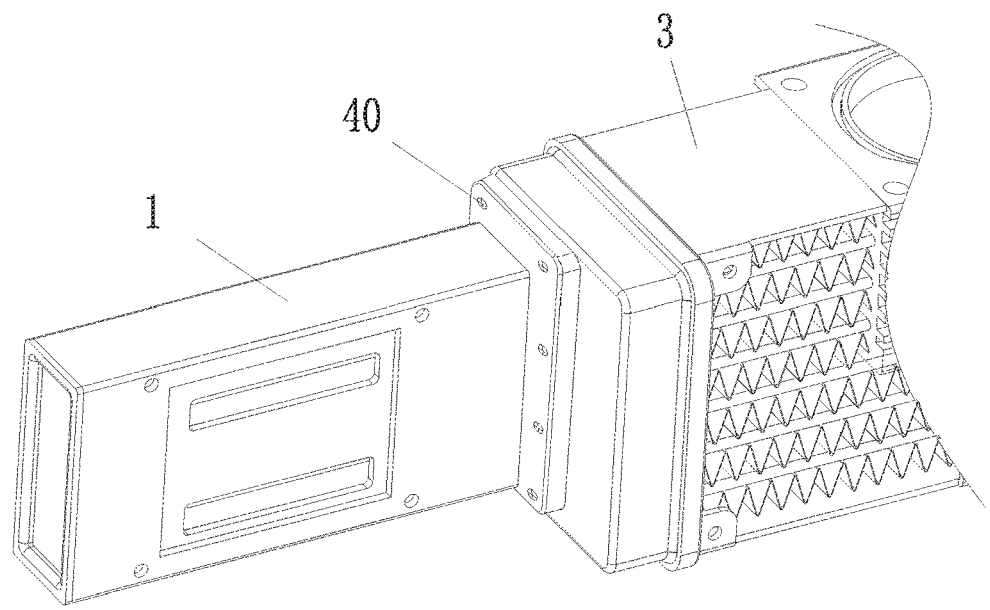
FIG. 5
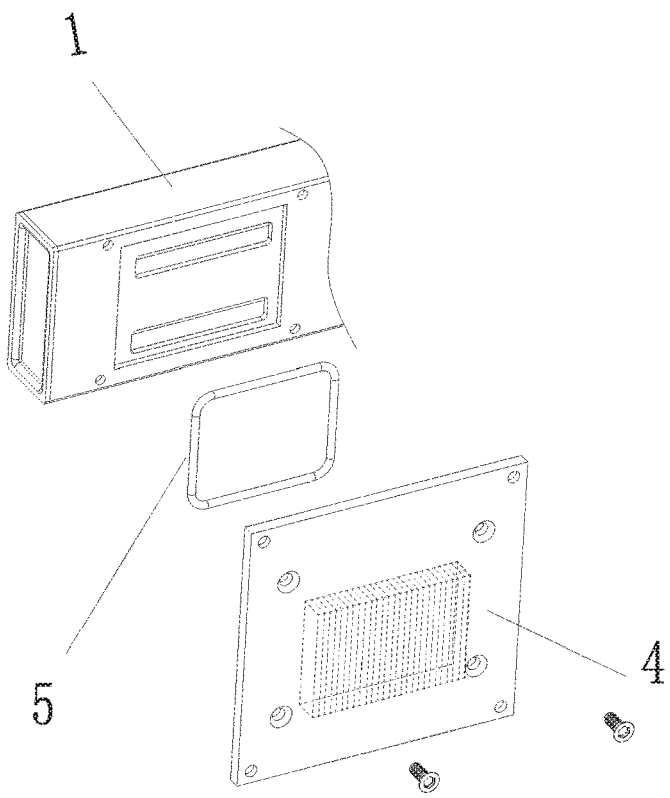
FIG. 6-a

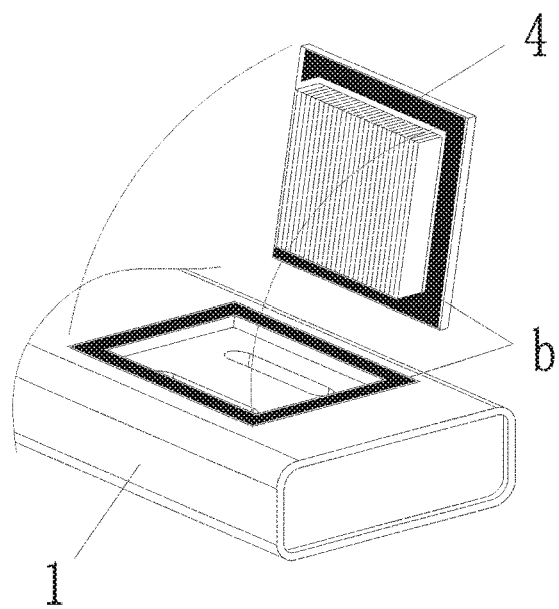
FIG. 6-b
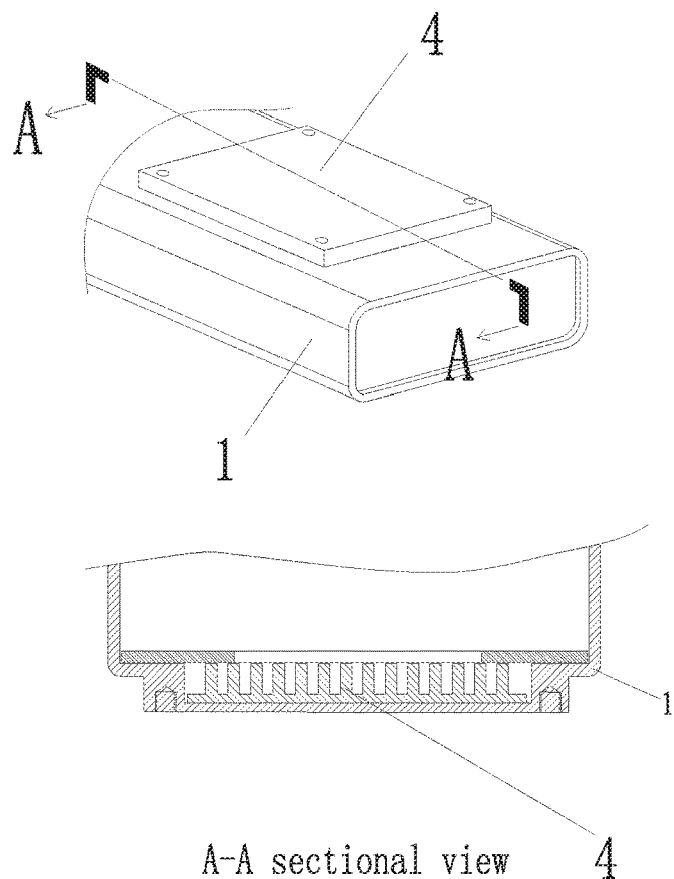
A-A sectional view
FIG. 6-c

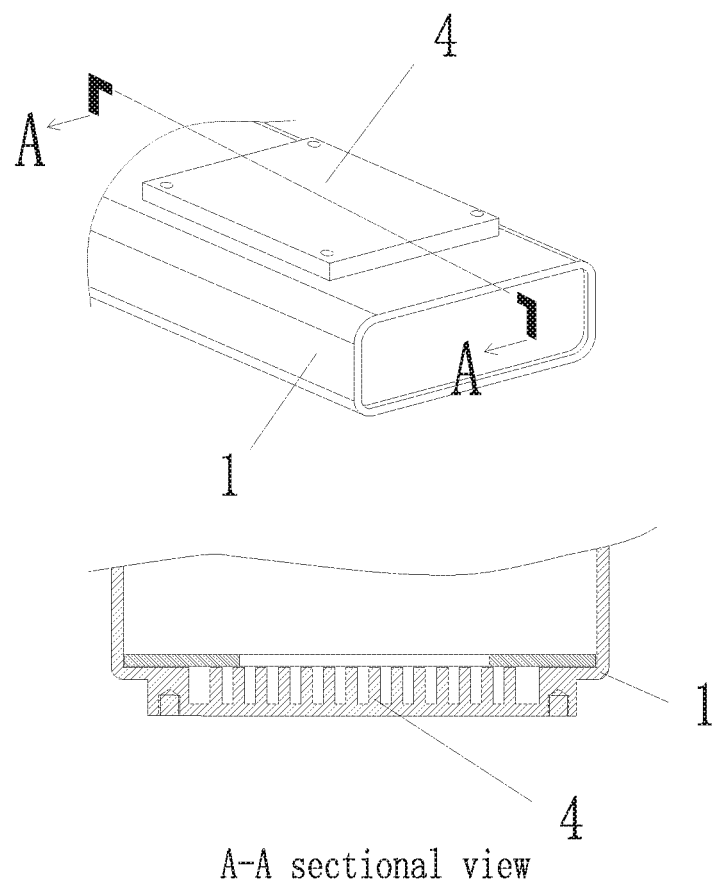
A-A sectional view
FIG. 6-d
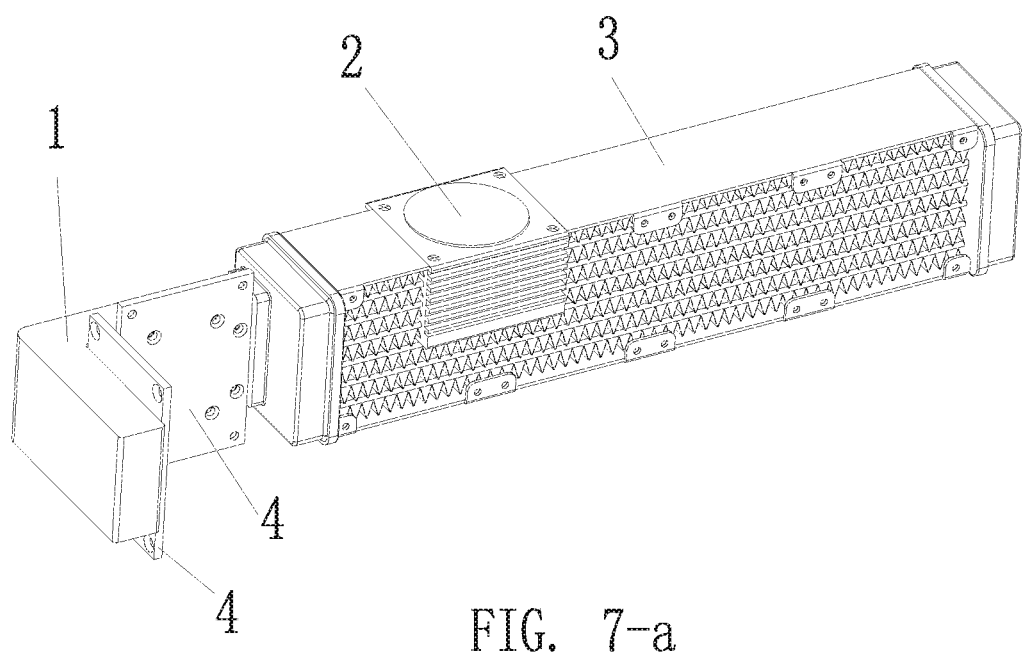
FIG. 7-a

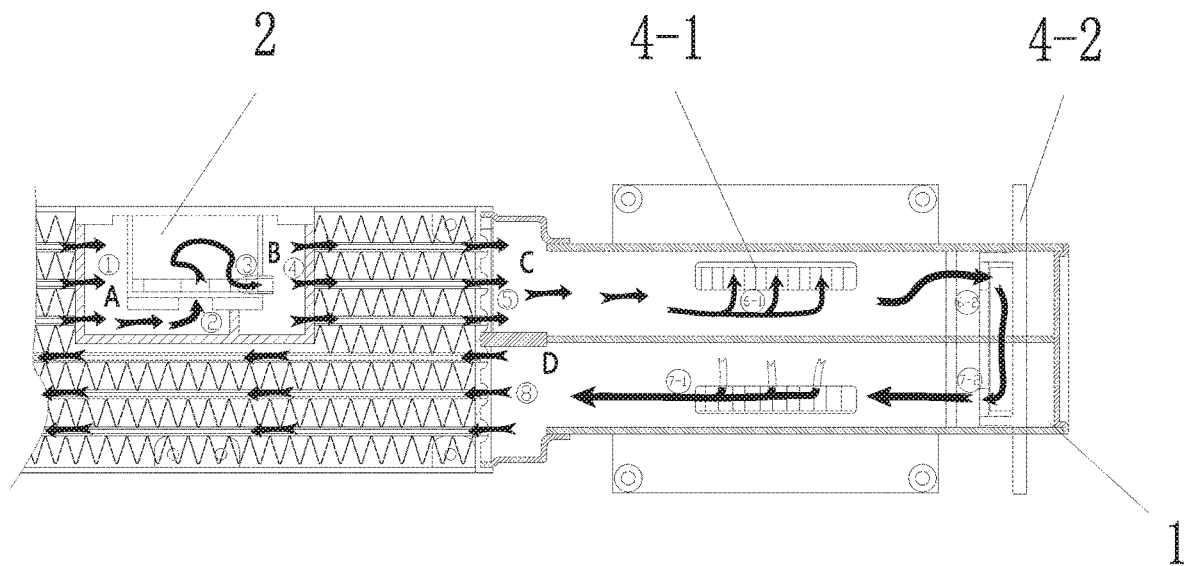
FIG. 7-b
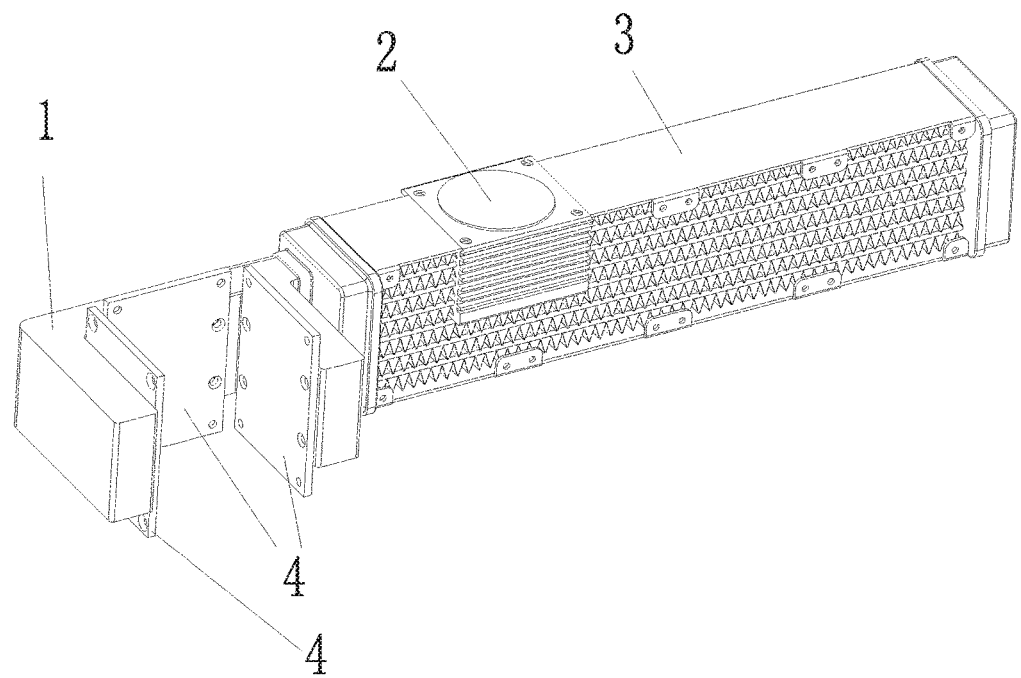
FIG. 8-a

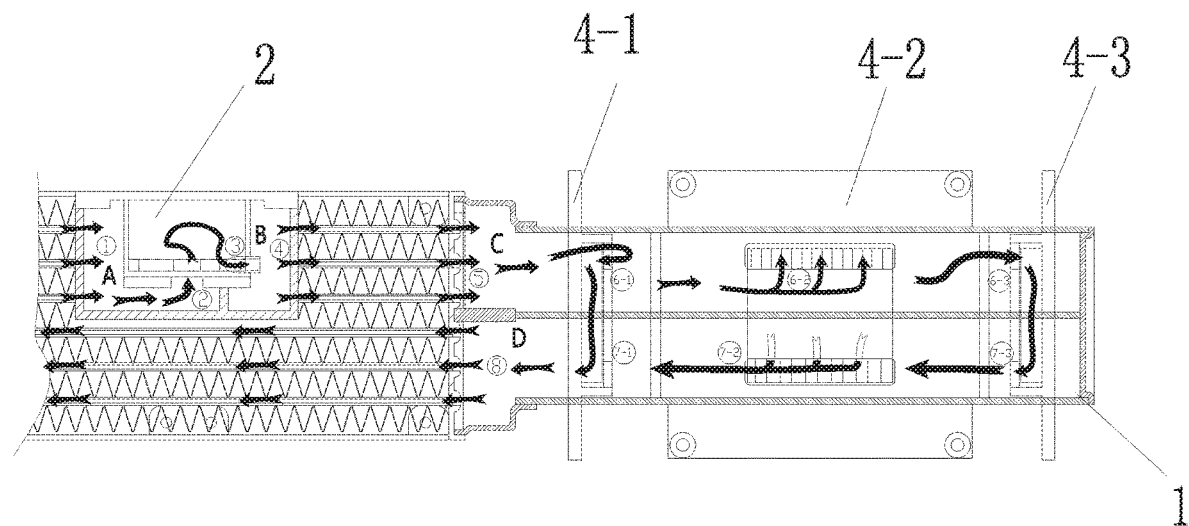
FIG. 8-b
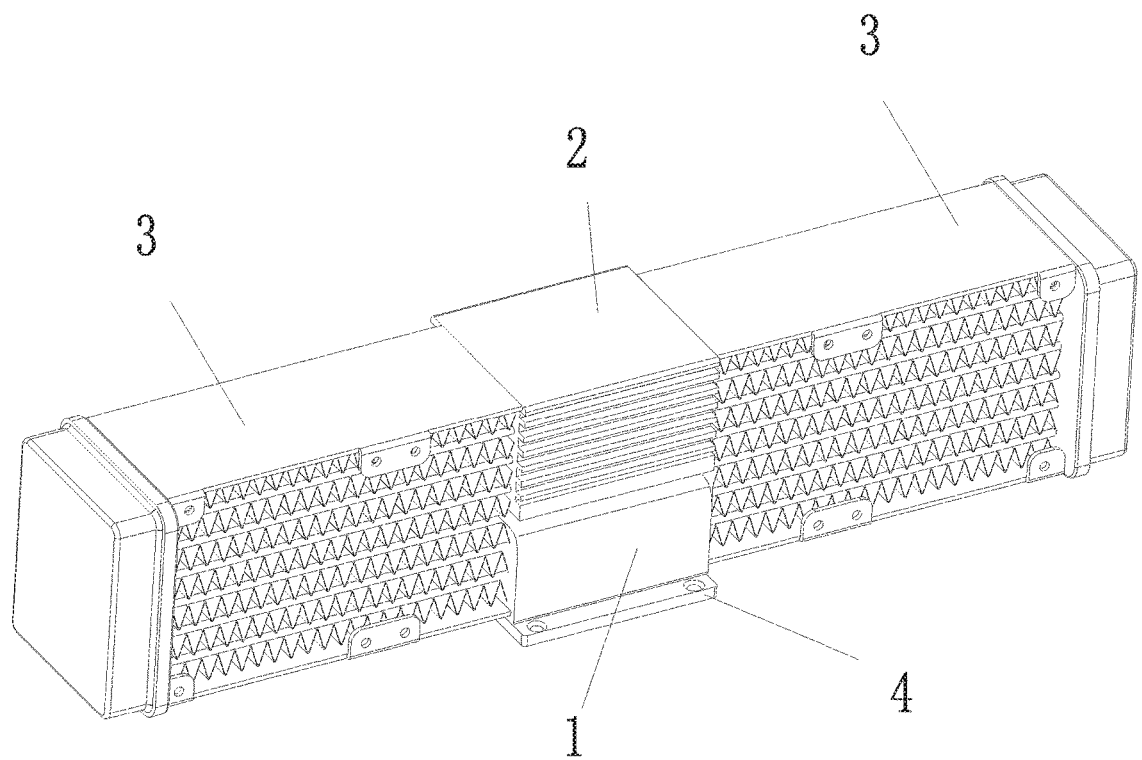
FIG. 9-a

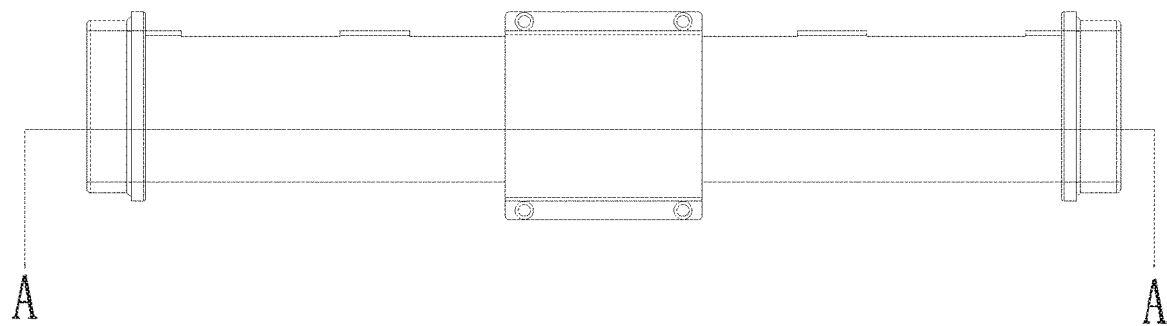
FIG. 9-b
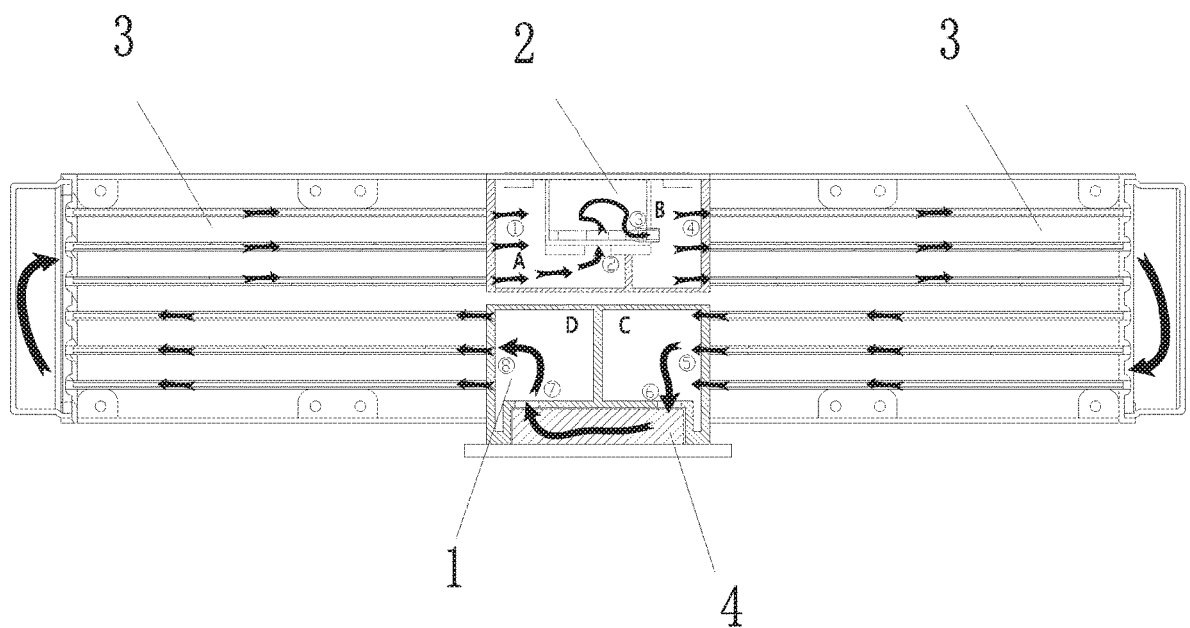
FIG. 9-c

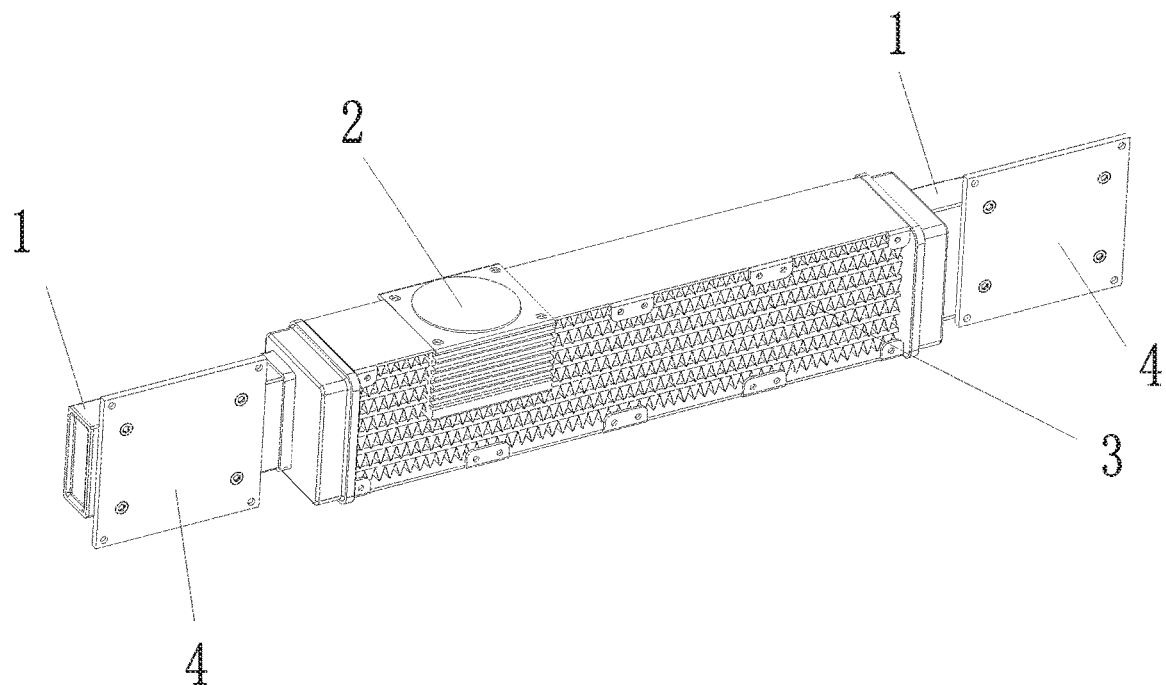
FIG. 10-a
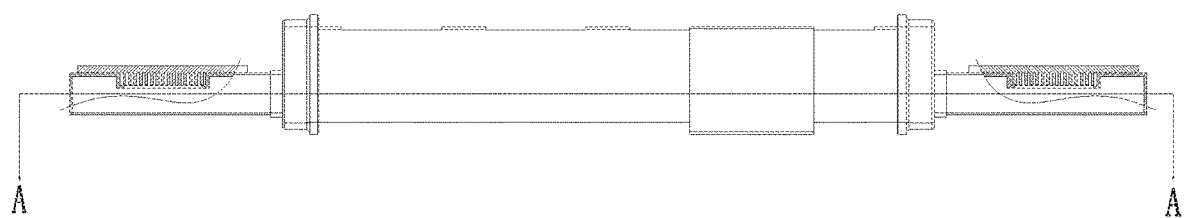
FIG. 10-b

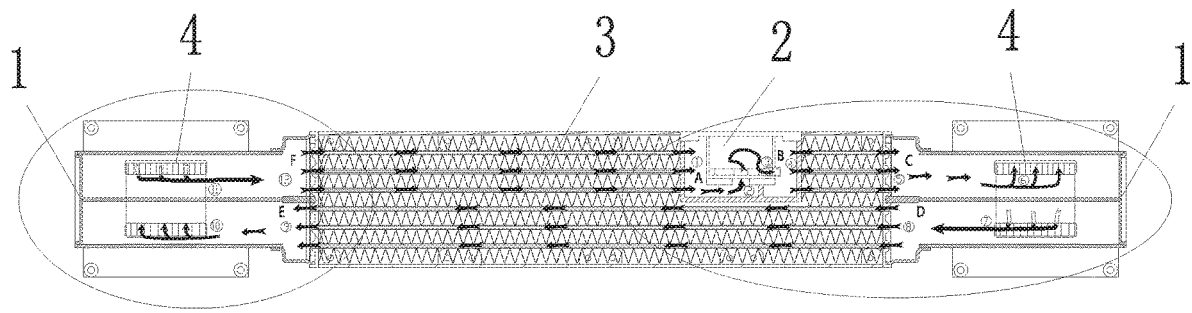
FIG. 10-c
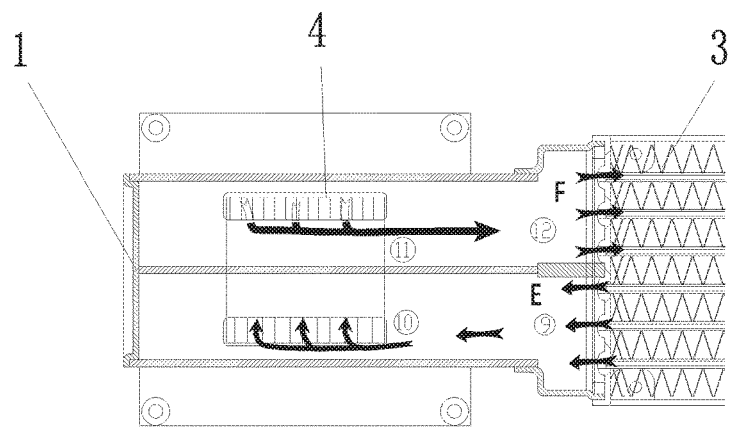
FIG. 10-c1
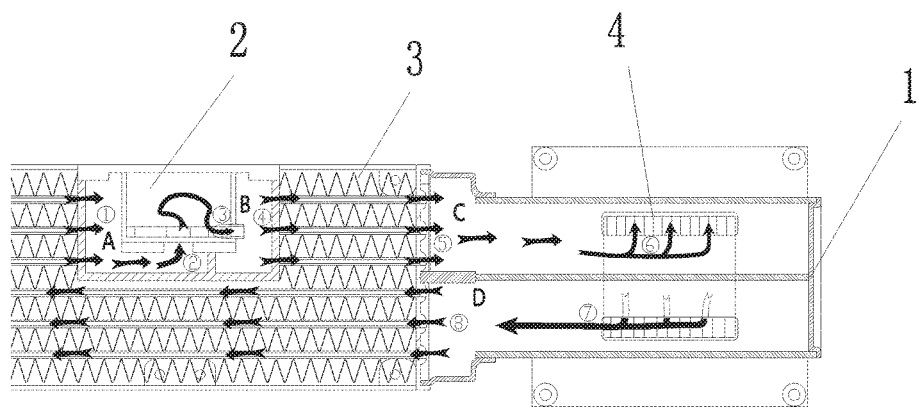
FIG. 10-c2

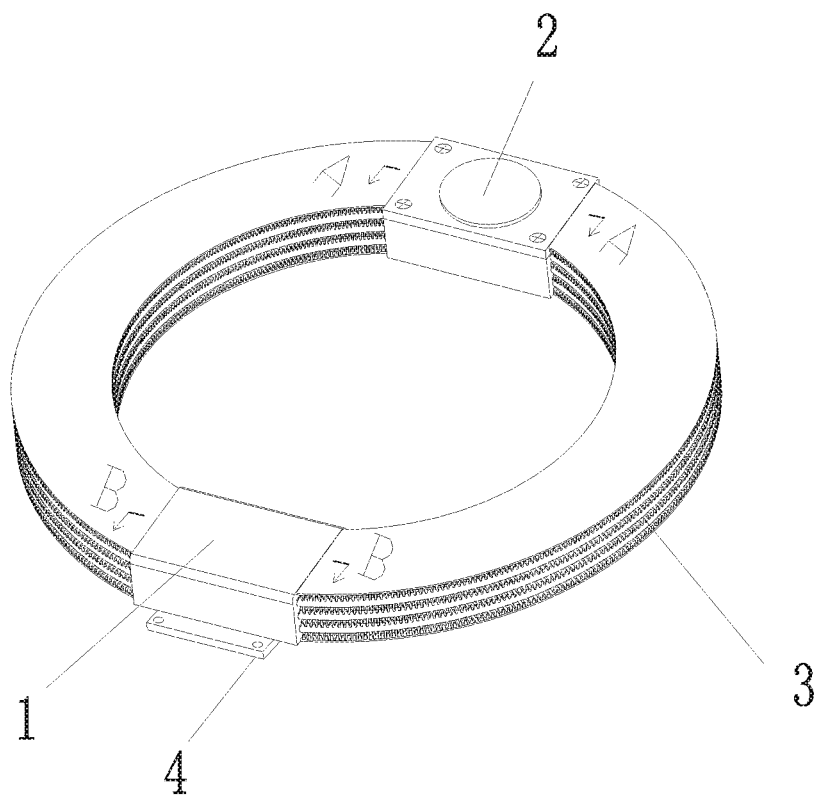
FIG. 11-a
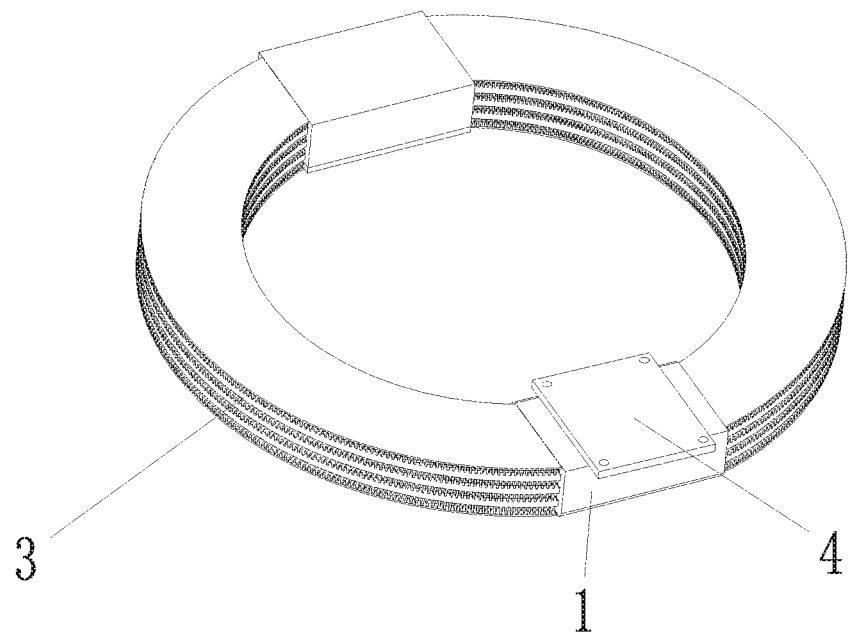
FIG. 11-b

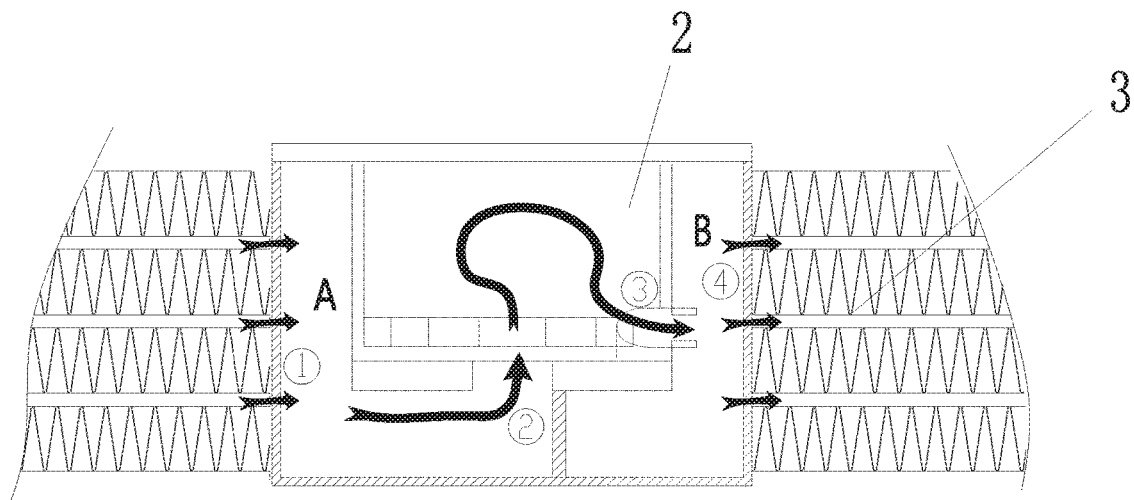
FIG. 11-c
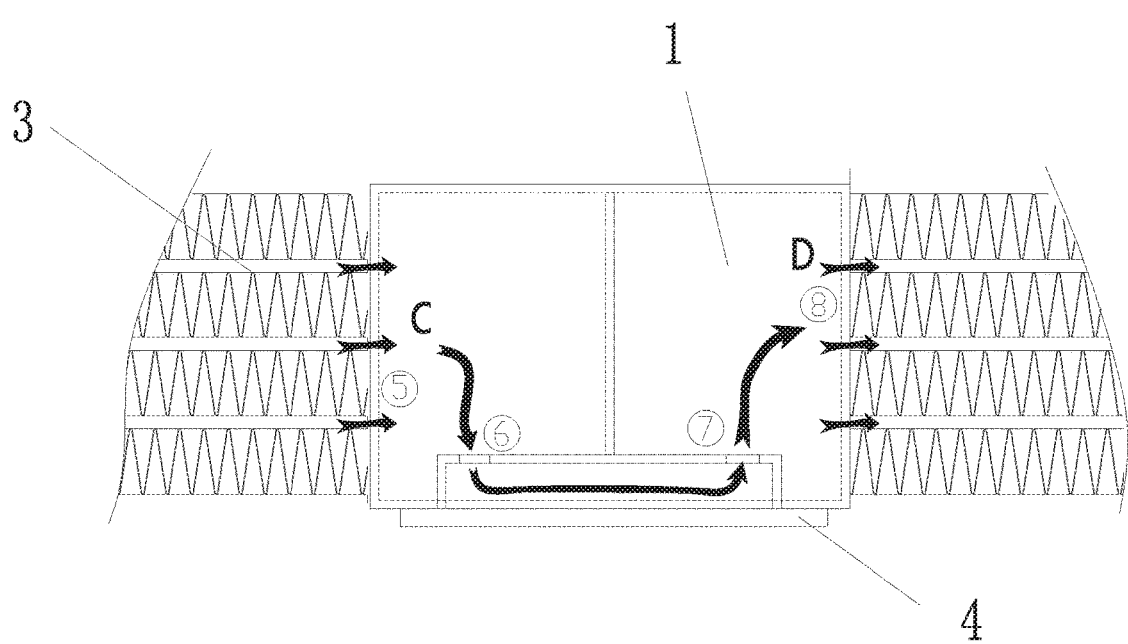
FIG. 11-d

INTEGRATED LIQUID-COOLED HEAT DISSIPATION SYSTEM

CROSS REFERENCE TO RELATED APPLICATIONS

This application is based upon and claims priority to Chinese Patent Application No. 201810560218.0, filed on Jun. 3, 2018, the entire contents of which are incorporated herein by reference.

TECHNICAL FIELD

The present invention relates to a liquid-cooled heat dissipation system, particularly to an integrated liquid-cooled heat dissipation system suitable for electronic equipment.

BACKGROUND

Currently, with the continuous increase of heat flux of high-end electronic products, the conventional extruded aluminum radiator and heat pipe radiator no longer meet the requirement of high efficiency heat dissipation, and the liquid-cooled heat dissipation technology has become a new favorite in the field of electronic heat dissipation. The commonly used liquid-cooled product available now mainly includes a heat absorption device, a pump, a fin radiator and pipes for connecting the above components. The heat absorption device is tightly close to a heat source (i.e., electronic chip such as CPU), under the driving of the pump, the liquid absorbs heat from the electronic device when flowing through the cold plate, and then enters the fin radiator to dissipate the heat into the ambient. Again, the cooled liquid flows through the heat absorption device, so as to transfer heat from the heat emitting chip to the ambient, circularly and continuously. The fin radiator may be cooled by natural air or forced cooling of a fan, and the cooling liquid may be deionized water, purified water added with antifreeze, or other liquid and mixture thereof (such as tetrafluoroethane R134a). Regarding the existing liquid-cooled radiator, since pipes are used to connect various components, there is a high risk of liquid leakage at the joints. Moreover, since the components are arranged dispersedly, and the structure is incompact, the limited heat dissipation space cannot be efficiently used to the maximum extent. Therefore, for the heat dissipation of electronic equipment having a heat source with large heat dissipation capacity, requiring a high safety coefficient, and having a limited arrangement space, the conventional dispersed or semi-integrated liquid-cooled heat dissipation systems are not suitable. The development of an integrated liquid-cooled heat dissipation system which has a high heat dissipation efficiency, compact structure, and simple assembly has become an inevitable technical trend.

SUMMARY

The technical problem to be solved by the present invention is, specific to the drawbacks of the liquid-cooled system in the prior art, to provide an integrated liquid-cooled heat dissipation system.

The technical solution used to solve the technical problem by the present invention is as follows. An integrated liquid-cooled heat dissipation system includes a heat dissipation device, a pumping device, a water reservoir, and a heat absorption device, which are integrated as a whole and interconnected with each other, a main body of the heat dissipation device is provided with the pumping device, wherein the water reservoir is integratedly arranged on the heat dissipation device, and the water reservoir is further provided with the heat absorption device.

The water reservoir is integratedly arranged at a middle, an end, or two ends of a cooling pipe of the heat dissipation device.

The water reservoir has a predetermined volume for liquid storage or circulation, and an interior thereof is partitioned into at least two parts.

The manufacturing process of the integrated configuration is realized by welding the raw materials of the water reservoir and the heat dissipation device through special equipment, directly or through a third-party welding flux, or locking and sealing the water reservoir and the heat dissipation device by a sealing device.

The pumping device includes a pump housing, an impeller, a motor, and a pump cover component, and the pumping device is locked and sealed with the water reservoir through the sealing device.

The heat absorption device is a metal piece with high heat conductivity. The heat absorption device is locked and sealed on the water reservoir through the sealing device, or integratedly welded on the water reservoir and sealed, or the interior of the water reservoir is provided with the heat absorption device, or the original internal structure of the water reservoir forms the heat absorption device.

The sealing device is an elastic gum seal ring, an elastic gum seal pad, or a glue-like filling and sealing material, etc.

The water reservoir may be provided and interconnected with N heat absorption devices, N≥2. The water reservoir may be connected with the N heat absorption devices in series or parallel, and the main body of the heat dissipation device is provided with the pumping device.

The overall structure of the water reservoir includes an L shape, a U shape, or an arc shape.

Compared with the separated design, the integrated liquid-cooled heat dissipation system of the present invention saves the occupation space of the equipment and facilitates the installation and use through the design of integratedly configuring the water reservoir on the heat dissipation device and further configuring the heat absorption device on the water reservoir. By partitioning the water reservoir into different spaces, the sealing effect of the flowing route circulation process of cooling liquid is better, thus the service life of the water reservoir is longer and the phenomenon of liquid leakage can be avoided. The pumping device is integratedly arranged on the heat dissipation device, thereby improving the efficiencies of the heat dissipation device and the pumping device, achieving a better effect when applied in electronic equipment of large heat dissipation capacity, and realizing heat dissipation for the device with multiple heat sources. Meanwhile, according to different equipment requirements, the integrated liquid-cooled heat dissipation system can meet requirements for customized heat dissipation of different electronic equipment.

BRIEF DESCRIPTION OF THE DRAWINGS

In order to clearly illustrate the technical solutions of the embodiments of the present invention, the drawings needed for the descriptions of the embodiments are briefly introduced below. Obviously, the drawings described below are merely some embodiments of the present invention, for those of ordinary skill in the art, other drawings can be derived according to these drawings without creative efforts. In the drawings:

FIG. 1-*a* is a structural schematic diagram of a first embodiment of the present invention;

FIG. 1-*b* is a structural schematic diagram of a second embodiment of the present invention;

FIG. 2-*a* is an exploded view of FIG. 1-*a*;

FIG. 2-*b* is an exploded view of FIG. 1-*b*;

FIG. 3-*a* shows a schematic diagram of FIG. 1-*a* and a sectional view of flowing routes;

FIG. 3-*a1* is a partially enlarged view of FIG. 3-*a*;

FIG. 3-*b* are a schematic diagram of FIG. 1-*b* and a sectional view of flowing routes;

FIG. 3-*b*1 is a partially enlarged view of an end of a heat absorption device in FIG. 3-*b*;

FIG. 3-*b*2 is a partially enlarged view of an end of a pumping device in FIG. 3-*b*;

FIG. 4-*a* is a schematic diagram showing a welding mode a between a water reservoir and a heat dissipation device of the present invention;

FIG. 4-*b* is a schematic diagram showing a welding mode b between a water reservoir and a heat dissipation device of the present invention;

FIG. 4-*c* is a schematic diagram showing a welding mode c between a water reservoir and a heat dissipation device of the present invention;

FIG. 5 is schematic diagram showing a locking mode between a water reservoir and a heat dissipation device of the present invention;

FIG. 6-*a* is schematic diagram showing a combination mode a between a heat absorption device and a water reservoir of the present invention;

FIG. 6-*b* is schematic diagram showing a combination mode b between a heat absorption device and a water reservoir of the present invention;

FIG. 6-*c* is schematic diagram showing a combination mode c between a heat absorption device and a water reservoir of the present invention;

FIG. 6-*d* is schematic diagram showing a combination mode d between a heat absorption device and a water reservoir of the present invention;

FIG. 7-*a* is a structural schematic diagram of an integrated liquid-cooled heat dissipation system according to a third embodiment of the present invention;

FIG. 7-*b* is a sectional view of flowing routes of FIG. 7-*a*;

FIG. 8-*a* is a structural schematic diagram of an integrated liquid-cooled heat dissipation system according to a fourth embodiment of the present invention;

FIG. 8-*b* is a sectional view of flowing routes of FIG. 8-*a*;

FIG. 9-*a* is a structural schematic diagram of an integrated liquid-cooled heat dissipation system according to a fifth embodiment of the present invention;

FIG. 9-*b* is a plane schematic view of FIG. 9-*a*;

FIG. 9-*c* is a sectional view of flowing routes of FIG. 9-*b* along an A-A direction;

FIG. 10-*a* is a perspective schematic view showing the structure of an integrated liquid-cooled heat dissipation system according to a sixth embodiment of the present invention;

FIG. 10-*b* is a plane schematic view of FIG. 10-*a*;

FIG. 10-*c* is a sectional view of flowing routes of FIG. 10-*b* along an A-A direction;

FIG. 10-*c*1 is a partially enlarged view of a first end of FIG. 10-*c*;

FIG. 10-*c*2 is a partial enlarged view of a second end of FIG. 10-*c*;

FIG. 11-*a* is a perspective schematic view showing the structure of an integrated liquid-cooled heat dissipation system according to a seventh embodiment of the present invention;

FIG. 11-*b* is a perspective schematic view of a reverse side of FIG. 11;

FIG. 11-*c* is a sectional view of flowing routes of FIG. 11-*a* along an A-A direction;

FIG. 11-*d* is a sectional view of flowing routes of FIG. 11-*a* along a B-B direction.

DETAILED DESCRIPTION OF THE EMBODIMENTS

In order to clarify the objectives, technical solutions and advantages of the present invention, the embodiments will be described hereinafter with reference to the corresponding drawings, and these drawings constitute a part of the embodiments. Various embodiments that may be implemented to realize the present invention are described. It should be understood that the present invention may further include other embodiments, or modifications of the listed embodiments in structure and function without departing from the scope and essence of the present invention.

Referring to FIG. 1-*a* and FIG. 1-*b*, FIG. 1-*a* is a structural schematic diagram of a first embodiment of the present invention, FIG. 1-*b* is a structural schematic diagram of a second embodiment of the present invention. The integrated liquid-cooled heat dissipation of the present invention includes water reservoir 1, pumping device 2, heat dissipation device 3, and heat absorption device 4, which are integrated as a whole and interconnected with each other. The main body of the heat dissipation device 3 is provided with the pumping device 2, the water reservoir 1 is integratedly arranged on one end of the heat dissipation device 3, and the water reservoir 1 is provided with the heat absorption device 4.

The difference between the technical solutions shown in FIG. 1-*a* and FIG. 1-*b* is that the pumping device 2 is arranged at different positions on the heat dissipation device 3. In the first embodiment, the pumping device 2 is integratedly connected between the cooling pipes 301 of the heat dissipation device, and the water reservoir 1 is welded at one end of the heat dissipation device. Specifically, referring to FIG. 2-*a*, the pumping device 2 includes pump housing 21, impeller 22, motor 23 and pump cover component 24. The pumping device 2 is locked and sealed with the heat dissipation device 3 through the sealing device 5 by screws. The heat absorption device 4 is locked, fixed, and sealed through the sealing device 5 by screws. It should be noted that the inner wall of the hole-slot structure may function as the pump housing of the pumping device, thereby saving the cost of the pumping device. Certainly, a complete pumping device may be mounted inside the hole-slot structure and interconnected with the hole-slot structure.

Specifically, FIG. 2-*b* is an exploded view of FIG. 1-*b*. In this embodiment, the pumping device 2 is arranged at one end of the heat dissipation device 3, and the water reservoir 1 is arranged at the other end of the heat dissipation device 3. Similarly, the pumping device 2 includes pump housing 21, impeller 22, motor 23, and pump cover component 24. The pumping device 2 is locked and sealed with the heat dissipation device 3 through sealing device 5 by screws.

Further, according to the first embodiment, the flowing routes of cooling liquid are shown in FIG. 3-*a*, where the upper one is a schematic diagram, and the lower one is a sectional view of flowing routes of the schematic diagram along an A-A direction. FIG. 3-a1 is a partially enlarged view of FIG. 3-a. Specifically, the cooling liquid flowing out of an upper half portion of the heat dissipation device 3 enters region A from a water outlet ①, then flows into a water inlet ② of the pumping device 2, under the pressure of pumping device 2, the cooling liquid then flows out of a water outlet ③ and enters region B, then enters an upper half portion of the heat dissipation device 3 through a water inlet ④. After passing through the heat dissipation device 3, the cooling liquid enters region C of the water reservoir from a water outlet ⑤, then enters a water inlet ⑥ of the heat absorption device 4, after absorbing heat, the cooling liquid flows out from a water outlet ⑦ to region D, and returns back to the upper half portion of heat dissipation device through a water inlet ⑧, thereby getting ready for a next circulation.

According to the second embodiment, FIG. 3-b1 and FIG. 3-b2 are partially enlarged views of an end of the heat absorption device and an end of the pumping device of FIG. 3-b. Referring to FIG. 3-b, FIG. 3-b 1, and FIG. 3-b2, the cooling liquid flowing out of a left side of the upper half portion of the heat dissipation device 3 enters region A from the water outlet ①, then flows into the water inlet ② of the pumping device 2, under the pressure of the pumping device 2, the cooling liquid flows out of the water outlet ③ and enters region B, then enters a left side of the lower half portion of the heat dissipation device through the water inlet ④. After passing through the heat dissipation device 3, the cooling liquid enters region C of water reservoir through the water outlet ⑤, then enters into the water inlet ⑥ of the heat absorption device 4, after absorbing heat, the cooling liquid flows out from the water outlet ⑦ to region D, and enters the heat dissipation device 3 through the water inlet ⑧, thereby getting ready for the next circulation.

The integrated welding between the water reservoir 1 and the heat dissipation device 3 includes welding two raw materials through special equipment directly after the interfaces of the two raw materials are butted with each other or through a third-party welding flux. FIG. 4-a is a schematic diagram showing a welding mode a between the water reservoir and the heat dissipation device of the present invention. In this case, the water reservoir 1 is provided with a plurality of holes 101, and corresponding portions of the heat dissipation device 3 are provided with a plurality of cooling pipes 301 matching with the holes 101. The water reservoir and the heat dissipation device may be integratedly manufactured by welding the contact surfaces.

FIG. 4-b is a schematic diagram showing a welding mode b between the water reservoir and the heat dissipation device of the present invention. An outer peripheral surface 102 of the edge of water reservoir 1 is integratedly welded with an inner peripheral surface 302 of the corresponding edge of heat dissipation device 3 to realize the integrated manufacturing of the water reservoir and the heat dissipation device.

FIG. 4-c is a schematic diagram showing a welding mode c between the water reservoir and the heat dissipation device of the present invention. An outer edge of the cooling pipe of heat dissipation device 3 is provided with a water chamber, and an outer edge of the water chamber is provided with an edge inner peripheral surface 303. The water reservoir 1 is provided with the corresponding outer peripheral surface 103, and the inner peripheral surface 303 is inserted into and welded with the outer peripheral surface 103.

FIG. 5 is schematic diagram showing a locking mode between the water reservoir and the heat dissipation device of the present invention. The water reservoir 1 is locked, fixed, and sealed through a seal ring and screws 40.

FIG. 6-a is schematic diagram showing a combination mode a between the heat absorption device and the water reservoir of the present invention. The heat absorption device 4 is locked and fixed on the water reservoir 1 through screws. FIG. 6-b is schematic diagram showing a combination mode b between the heat absorption device and the water reservoir of the present invention. An outer edge peripheral surface of the heat absorption device 4 is coated with a welding flux. Correspondingly, the water reservoir 1 is also coated with a welding flux. The heat absorption device 4 can be integratedly welded with the water reservoir 1 through the welding flux. Referring to FIG. 6-c, the interior of the water reservoir 1 is provided with a metal piece with high heat conductivity, and the metal piece is locked and fixed at the bottom of the interior of water reservoir 1, or the metal piece is integratedly welded at the bottom of the interior of water reservoir 1 to form the heat dissipation device. FIG. 6-d is a schematic diagram showing a combination mode d between the heat absorption device and the water reservoir of the present invention. The heat absorption device 4 is an originally formed structure in the interior of the water reservoir 1, i.e., an integrated heat absorption structure inside the water reservoir 1 which is obtained by mechanical processing, growth, or numerical control machining. According to FIG. 6-c and FIG. 6-d, when the heat absorption device 4 is disposed inside the water reservoir 1 and transfers heat from the heat emitting device, an outer surface of water reservoir 1 corresponding to the heat absorption device 4 is directly attached to the heat emitting device to realize heat transfer.

FIG. 7-a is a structural schematic diagram of an integrated liquid-cooled heat dissipation system according to a third embodiment of the present invention. In this case, the pumping device is integratedly arranged between the cooling pipes of the heat dissipation device. The water reservoir is L-shaped. The heat absorption device is disposed at the inner side of the L-shaped water reservoir, and there are two heat absorption devices perpendicular to each other. Certainly, the heat absorption device may be disposed at an outer side, an upper side, or a lower side of the L-shaped water reservoir as needed.

FIG. 7-b is a sectional view of flowing routes of FIG. 7-a. According to this embodiment, the cooling liquid flowing out of a left side of an upper half portion of the heat dissipation device 3 enters region A from a water outlet ①, then flows into a water inlet ② of the pumping device 2, under the pressure of the pumping device 2, the cooling liquid flows out of a water outlet ③ and enters region B, then enters a right side of an upper half portion of the heat dissipation device through a water inlet ④. After passing through the heat dissipation device 3 and getting dissipated, the cooling liquid enters region C of the water reservoir through a water outlet ⑤, then evenly enters into water inlets ⊙ and ⊙ of the heat absorption devices 4-1 and 4-2, after absorbing heat, the cooling liquid flows out from water outlets ⊙ and ⊙ to region D, then enters into a water inlet ⑧ of a lower half portion of the heat dissipation device, and then returns back to the upper half portion of the heat dissipation device 3 through a U-shaped flowing route, thereby getting ready for the next circulation.

FIG. 8-a is a structural diagram of an integrated liquid-cooled heat dissipation system according to a fourth embodiment of the present invention. According to this embodiment, three heat absorption devices are provided, the water reservoir is U-shaped, and the three inner sides of the U-shaped water reservoir is each provided with one of the three heat absorption devices. FIG. 8-b is a sectional view of flowing routes of FIG. 8-*a*. The cooling liquid flowing out of a left side of an upper half portion of the heat dissipation device 3 enters region A from a water outlet ①, then flows into a water inlet ② of the pumping device, under the pressure of the pumping device, the cooling liquid flows out of a water outlet ③ and enters region B, then enters a right side of the upper half portion of the heat dissipation device through a water inlet ④. After passing through the heat dissipation device 3, the cooling liquid enters region C of the water reservoir through a water outlet ⑤, then evenly enters into water inlets ⊖, ⊖ and ⊖ of the heat absorption devices 4-1, 4-2 and 4-3. After absorbing heat, the cooling liquid flows out from water outlets ⊖, ⊖ and ⊖ to region D, then enters a lower half portion of the heat dissipation device through a water inlet ⑧, and then returns back to the upper half portion of the heat dissipation device through a U-shaped flowing route, thereby getting ready for the next circulation.

FIG. 9-*a* is a perspective schematic diagram showing the structure of an integrated liquid-cooled heat dissipation system according to a fifth embodiment of the present invention. The pumping device 2 and water reservoir 1 are both arranged between the cooling pipes of the heat dissipation device 3, and stacked together. It should be noted that the pumping device and the water reservoir are two separate components that are not directly connected. The two components are respectively connected to the cooling pipes of the heat dissipation device. FIG. 9-*b* is a plane schematic view of FIG. 9-*a*, and FIG. 9-*c* is a sectional view of flowing routes of FIG. 9-*b* along an A-A direction. The cooling liquid flowing out of an upper half portion of the heat dissipation device 3 enters region A from a water outlet ①, then flows into a water inlet ② of the pumping device, under the pressure of the pumping device, the cooling liquid flows out of a water outlet ③ and enter region B, then enters the upper half portion of the heat dissipation device 3 through a water inlet ④. After passing through a lower half portion of the heat dissipation device 3 through a U-shaped flowing route, the cooling liquid enters region C of the water reservoir by a water outlet ⑤, then enters into a water inlet ⑥ of the heat absorption device. After absorbing heat, the cooling liquid flows out from the water outlet ⑦ to region D, then enters into a water inlet ⑧ of a lower half portion of the heat dissipation device 3, and then returns back to the upper half portion of heat dissipation device 3 through a U-shaped flowing route, thereby getting ready for the next circulation.

FIG. 10-*a* is a perspective schematic view showing the structure of an integrated liquid-cooled heat dissipation system according to a sixth embodiment of the present invention. According to this embodiment, two water reservoirs 1 are respectively disposed at two sides of the heat dissipation device. Also, the two water reservoirs at two sides are respectively provided with a heat absorption device 4. The pumping device is arranged between the cooling pipes of heat dissipation device. FIG. 10-*b* is a plane view of FIG. 10-*a*.

FIG. 10-*c* is a sectional view of flowing routes of FIG. 10-*b* along an A-A direction, and FIG. 10-*c*1 and FIG. 10-*c*2 are partially enlarged views showing the flowing routes of two ends of FIG. 10-*c*. The cooling liquid flowing out of a left side of an upper half portion of the heat dissipation device 3 enters region A from a water outlet ①, then flows into a water inlet ② of the pumping device, under the pressure of the pumping device, the cooling liquid flows out of a water outlet ③ and enters region B, then enters a right side of the upper half portion of the heat dissipation device through a water inlet ④. After passing through the heat dissipation device, the cooling liquid enters region C of the water reservoir 1 through a water outlet ⑤, then enters into a water inlet ⑥ of the heat absorption device 4. After absorbing heat, the cooling liquid flows out from water outlet ⑦ to region D, then enters a lower half portion of the heat dissipation device through a water inlet ⑧. After passing through the heat dissipation device, the cooling liquid enters region E of water reservoir 1 through a water outlet ⑨, then enters into a water inlet ⑩ of the heat absorption device 4. After absorbing heat, the cooling liquid flows out from a water outlet ⑪ to region F, and then returns back to the upper half portion of heat dissipation device through a water inlet ⑫, thereby getting ready for the next circulation.

FIG. 11-*a* is a perspective schematic view showing the structure of an integrated liquid-cooled heat dissipation system according to a seventh embodiment of the present invention. According to this embodiment, the heat dissipation device 3 is arc-shaped, two ends the heat dissipation device 3 are respectively connected to the pumping device and the water reservoir to form an annular shape. The pumping device and water reservoir having such structure are respectively arranged between the cooling pipes of the heat dissipation device. The heat absorption device 4 is disposed at a side of the water reservoir 1. FIG. 11-*b* is a perspective schematic view of a reverse side of FIG. 11, FIG. 11-*c* is a sectional view of flowing routes of FIG. 11-*a* along an A-A direction, and FIG. 11-*d* is a sectional view of flowing routes of FIG. 11-*a* along a B-B direction. As shown in the sectional view of flowing routes along the A-A direction, the cooling liquid flowing out of a left side of the heat dissipation device 3 enters region A from a water outlet ①, then flows into a water inlet ② of the pumping device, under the pressure of the pumping device 2, the cooling liquid flows out of a water outlet ③ and enters region B, and then enters a right side of the heat dissipation device through a water inlet ④. After that, the cooling liquid enters a left side of the heat dissipation device as shown in the sectional view along the B-B direction, then enters region C through a water outlet ⑤, and then enters a water inlet ⑥ of the heat absorption device. After absorbing heat, the cooling liquid flows out from a water outlet ⑦ to region D, and then returns back to the left side of the heat dissipation device shown in the sectional view along the A-A direction through a water inlet ⑧, thereby getting ready for the next circulation.

It should be noted that, the power required for the circulation of cooling liquid of the present invention is all provided by the pumping device 2. The processing method for the integrated interconnection between the water reservoir 1 and power system, and the structural design of integrated water reservoir, power system and the heat dissipation device includes but not limited to welding, casting, numerical control milling machining or 3D print molding. The pumping device may be a centrifugal pump, an axial flow pump, and a mixed-flow pump. The heat dissipation device has the same design as the water reservoir, which can realize large-area heat dissipation. Namely, a plurality of small size heat dissipation device form a large size heat dissipation device to accelerate the speed of heat dissipation. The connection mode between the heat dissipation device and the water reservoir may be welding, glue connection, etc. The cooling fins of the heat dissipation device may be wave strip shaped or plate-shaped, etc. The heat dissipation device may be equipped with a fan to enhance heat dissipation effect.

Compared with the separated design, the integrated liquid-cooled heat dissipation system of the present invention saves the occupation space of the equipment and facilitates the installation and use through the design of integratedly configuring the water reservoir on the heat dissipation device and further configuring the heat absorption device on the water reservoir. By partitioning the water reservoir into different spaces, the sealing effect of the flowing route circulation process of cooling liquid is better, thus the service life of the water reservoir is longer and the phenomenon of liquid leakage can be avoided. The pumping device is integratedly arranged on the heat dissipation device, thereby improving the efficiencies of the heat dissipation and the pumping device, achieving a better effect when applied in electronic equipment of large heat dissipation capacity, and realizing heat dissipation for device with multiple heat sources. Meanwhile, according to different equipment requirements, the integrated liquid-cooled heat dissipation system can meet requirements for customized heat dissipation of different electronic equipment.

The above descriptions merely involve the preferred embodiments of the present invention. Various changes or equivalent substitutions to these features and embodiments can be derived by those skilled in the art without departing from the spirit and scope of the invention. In addition, with the teachings of the present invention, these features and embodiments may be modified to adapt to the specific circumstances and materials without departing from the spirit and scope of the invention. Therefore, the present invention is not limited to the specific embodiments disclosed herein, and all the embodiments falling within the scope of the claims of the present application should be considered as falling within the scope of the present invention.

I claim:

1. An integrated liquid-cooled heat dissipation system, comprising: a heat dissipation device, a pumping device, a water reservoir, and a heat absorption device, wherein, the heat dissipation device, the pumping device, the water reservoir, and the heat absorption device are integrated as a whole and interconnected with each other, a main body of the heat dissipation device is provided with the pumping device;

the water reservoir is integratedly arranged on and connected to the heat dissipation device; and the heat absorption device is arranged on the water reservoir, wherein the water reservoir is integratedly arranged at a middle of a cooling pipe of the heat dissipation device.

2. The integrated liquid-cooled heat dissipation system of claim 1, wherein the water reservoir has a predetermined volume for liquid storage or liquid circulation; and an interior of the water reservoir is partitioned into at least two parts.

3. The integrated liquid-cooled heat dissipation system of claim 1, wherein a manufacturing process of an integrated configuration of the water reservoir and the heat dissipation device is realized by welding raw materials of the water reservoir and the heat dissipation device through special equipment directly, welding raw materials of the water reservoir and the heat dissipation device through a third-party welding flux, or locking and sealing the water reservoir and the heat dissipation device by a sealing device.

4. An integrated liquid-cooled heat dissipation system, comprising: a heat dissipation device, a pumping device, a water reservoir, and a heat absorption device, wherein, the heat dissipation device, the pumping device, the water reservoir, and the heat absorption device are integrated as a whole and interconnected with each other, a main body of the heat dissipation device is provided with the pumping device; the water reservoir is integratedly arranged on and connected to the heat dissipation device; and the heat absorption device is arranged on the water reservoir, wherein the pumping device comprises a pump housing, an impeller, a motor, and a pump cover component; and the pumping device is locked and sealed with the water reservoir through a sealing device.

5. The integrated liquid-cooled heat dissipation system of claim 1, wherein the integrated liquid-cooled heat dissipation system is pipeless; the heat absorption device is a metal piece with a high heat conductivity; the heat absorption device is locked and sealed on the water reservoir through a sealing device; the heat absorption device is integratedly welded and sealed on the water reservoir; an interior of the water reservoir is provided with the heat absorption device; or an original internal structure of the water reservoir forms the heat absorption device.

6. The integrated liquid-cooled heat dissipation system of claim 3, wherein the sealing device is an elastic gum seal ring, an elastic gum seal pad, or a glue-like filling and sealing material.

7. The integrated liquid-cooled heat dissipation system of claim 6, wherein the water reservoir is provided and interconnected with N heat absorption devices, N.gtoreq.2; the water reservoir is connected to the N heat absorption devices in series or in parallel; and the main body of the heat dissipation device is provided with the pumping device.

8. The integrated liquid-cooled heat dissipation system of claim 7, wherein a shape of an overall structure of the water reservoir is an L shape, a U shape, or an arc shape.

9. An integrated liquid-cooled heat dissipation system, comprising: a heat dissipation device, a pumping device, a water reservoir, and a heat absorption device, wherein, the heat dissipation device, the pumping device, the water reservoir, and the heat absorption device are integrated as a whole and interconnected with each other, a main body of the heat dissipation device is provided with the pumping device; the water reservoir is integratedly arranged on and connected to the heat dissipation device; and the heat absorption device is arranged on the water reservoir, wherein a plurality of water reservoirs are integratedly arranged at two ends of a cooling pipe of the heat dissipation device.

10. The integrated liquid-cooled heat dissipation system of claim 4, wherein the sealing device is an elastic gum seal ring, an elastic gum seal pad, or a glue-like filling and sealing material.

11. The integrated liquid-cooled heat dissipation system of claim 5, wherein the sealing device is an elastic gum seal ring, an elastic gum seal pad, or a glue-like filling and sealing material.

* * * * *